(12) United States Patent
Kopp et al.

(10) Patent No.: US 10,446,717 B2
(45) Date of Patent: Oct. 15, 2019

(54) OPTOELECTRONIC SEMICONDUCTOR CHIP

(71) Applicant: OSRAM Opto Semiconductors GmbH, Regensburg (DE)

(72) Inventors: Fabian Kopp, Penang (MY); Attila Molnar, Gelugor (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 4 days.

(21) Appl. No.: 15/573,467

(22) PCT Filed: May 9, 2016

(86) PCT No.: PCT/EP2016/060333
§ 371 (c)(1),
(2) Date: Nov. 12, 2017

(87) PCT Pub. No.: WO2016/180779
PCT Pub. Date: Nov. 17, 2016

(65) Prior Publication Data
US 2018/0108811 A1    Apr. 19, 2018

(30) Foreign Application Priority Data

May 13, 2015   (DE) ................. 10 2015 107 577

(51) Int. Cl.
*H01L 33/38* (2010.01)
*H01L 33/62* (2010.01)
(Continued)

(52) U.S. Cl.
CPC ........ *H01L 33/382* (2013.01); *H01L 33/0008* (2013.01); *H01L 33/145* (2013.01); *H01L 33/62* (2013.01); *H01L 33/10* (2013.01)

(58) Field of Classification Search
CPC ......... H01L 2924/0002; H01L 2924/00; H01L 33/382; H01L 33/20; H01L 33/22; H01L 33/62; H01L 33/08; H01L 33/405
(Continued)

(56) References Cited

U.S. PATENT DOCUMENTS 8,686,451 B2 * 4/2014 Gmeinwieser ...... H01L 25/0756
257/79
8,772,806 B2 * 7/2014 Hwang .................. H01L 27/15
257/98

(Continued)

FOREIGN PATENT DOCUMENTS

DE   102014115740 A1   5/2016

*Primary Examiner* — Jonathan Han
(74) *Attorney, Agent, or Firm* — Slater Matsil, LLP

(57) ABSTRACT

An optoelectronic semiconductor chip is disclosed. In an embodiment the chip includes at least one n-doped semiconductor layer, at least one p-doped semiconductor layer and an active layer arranged between the at least one n-doped semiconductor layer and the at least one p-doped semiconductor layer, wherein the p-doped semiconductor layer is electrically contacted by a p-type connection contact, wherein a first trench extending at least partially into the p-doped semiconductor layer is arranged below the p-type connection contact, wherein an electrically insulating first blocking element arranged at least partially below the p-type connection contact and at least partially within the trench is arranged at least between the n-doped semiconductor layer and the p-type connection contact, and wherein the electrically insulating first blocking element is configured to prevent a direct current flow between the p-type connection contact and the p-doped and n-doped semiconductor layers and the active layer.

16 Claims, 6 Drawing Sheets

(51) Int. Cl.
*H01L 33/14* (2010.01)
*H01L 33/00* (2010.01)
*H01L 33/10* (2010.01)

(58) Field of Classification Search
USPC ............ 257/98, 99, E33.056, E33.068, 103
See application file for complete search history.

(56) References Cited

U.S. PATENT DOCUMENTS

| | | | |
|---|---|---|---|
| 2003/0222249 A1* | 12/2003 | Bunyan | H01L 23/3737 252/500 |
| 2003/0222269 A1 | 12/2003 | Lin et al. | |
| 2008/0157115 A1* | 7/2008 | Chuang | H01L 33/10 257/99 |
| 2010/0283070 A1* | 11/2010 | Kim | H01L 33/382 257/98 |
| 2011/0210345 A1 | 9/2011 | Lim et al. | |
| 2011/0298006 A1* | 12/2011 | Hagino | B82Y 20/00 257/103 |
| 2012/0049234 A1 | 3/2012 | Cheng | |
| 2014/0014994 A1* | 1/2014 | Chen | H01L 33/405 257/98 |
| 2015/0060924 A1* | 3/2015 | Lin | H01L 33/38 257/98 |

* cited by examiner

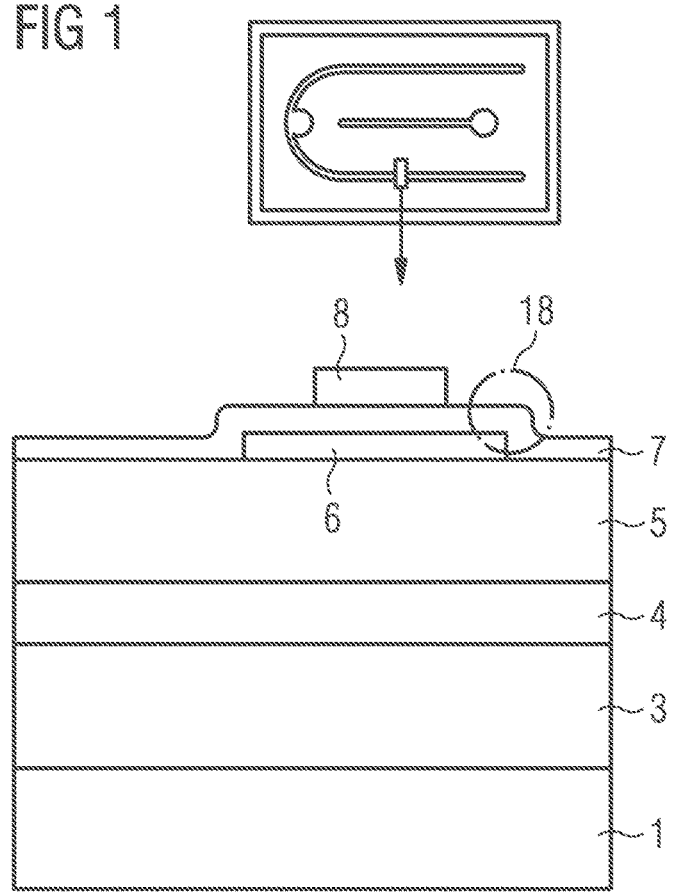
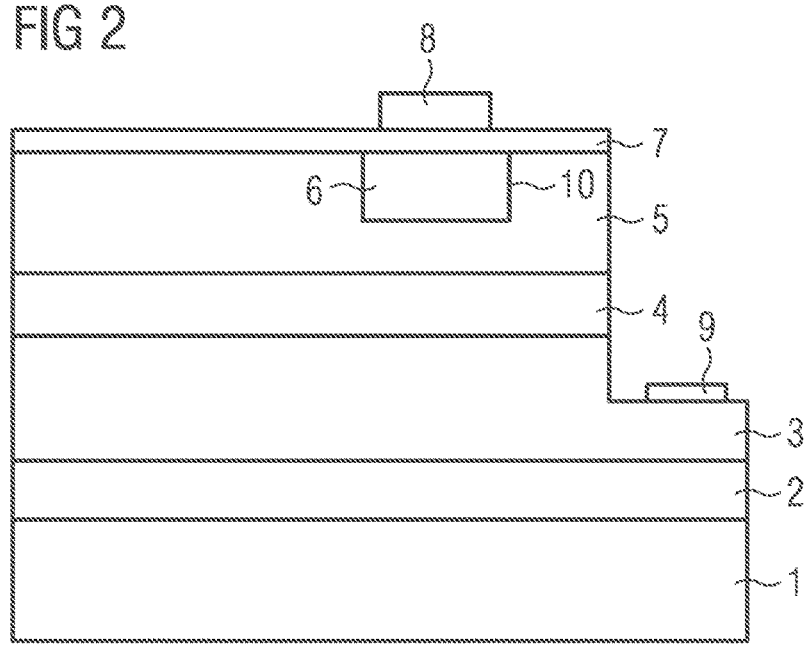

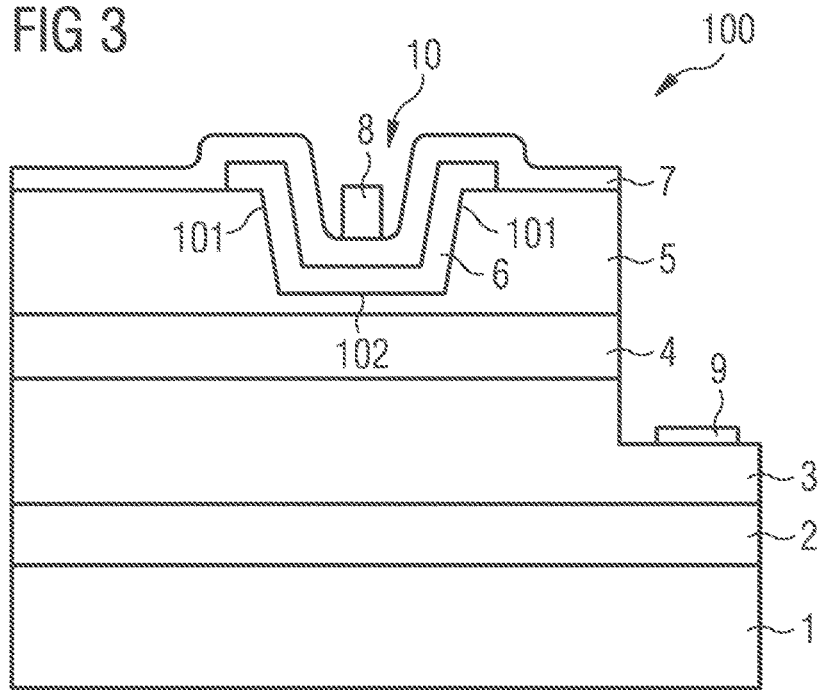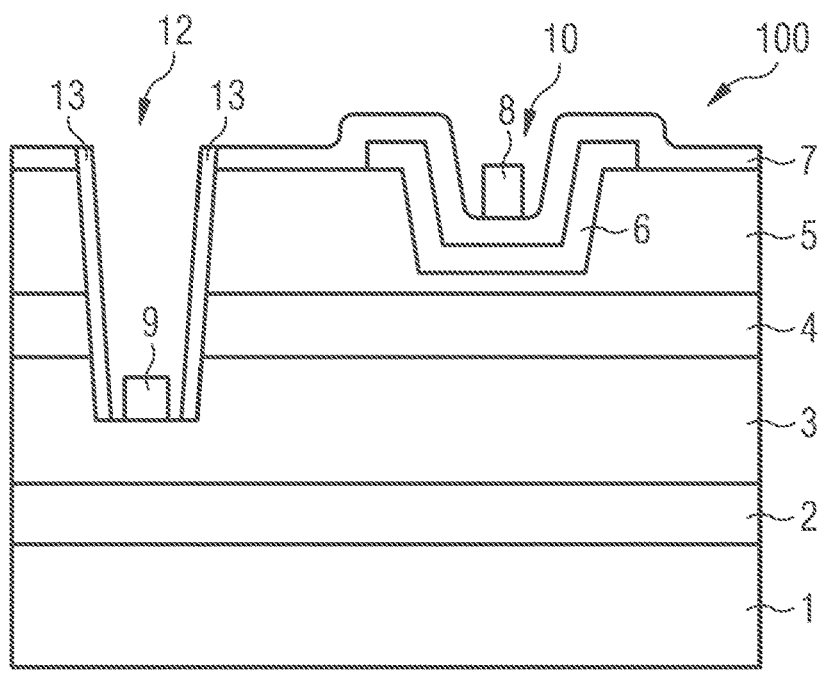

OPTOELECTRONIC SEMICONDUCTOR CHIP

This patent application is a national phase filing under section 371 of PCT/EP2016/060333, filed May 9, 2016, which claims the priority of German patent application 10 2015 107 577.6, filed May 13, 2015, each of which is incorporated herein by reference in its entirety.

TECHNICAL FIELD

The invention relates to an optoelectronic semiconductor chip, in particular a radiation-emitting optoelectronic semiconductor chip such as an LED chip.

BACKGROUND

In optoelectronic semiconductor chip such as LED chips, blocking elements can usually be attached below metal connection contacts in order to prevent a direct current flow into the semiconductor layer sequence. The blocking element is applied on to the semiconductor layer sequence below the metal connection contact and thus increases the thickness of the LED chip in the cross-section at least in places where the connection contact is located. Thus, the connection contact can be mechanically damaged during chip production, e.g., be scratched. This leads to an increased degradation during the operation of the optoelectronic semiconductor chip as a consequence of the material damages.

SUMMARY OF THE INVENTION

Embodiments provide an improved optoelectronic semiconductor chip. In various embodiments, at least a connection contact is to be protected against mechanical damage during the production.

In at least one embodiment, the optoelectronic semiconductor chip includes at least one n-doped semiconductor layer and at least one p-doped semiconductor layer. An active layer is arranged between the n-doped semiconductor layer and the p-doped semiconductor layer. The p-doped semiconductor layer is electrically contacted by means of a p-type connection contact. A trench is arranged below the p-type connection contact. The trench at least partially extends into the p-doped semiconductor layer. A blocking element is arranged at least between the p-doped semiconductor layer and/or the n-doped semiconductor layer and the p-type connection contact. The blocking element is arranged at least partially below the p-type connection contact and at least partially within the trench. The blocking element is electrically insulating. The blocking element prevents a direct current flow between the p-type connection contact and the p-doped and/or n-doped semiconductor layers and/or the active layer.

According to at least one embodiment of the optoelectronic semiconductor chip, this chip includes at least one n-doped semiconductor layer and at least one p-doped semiconductor layer. The semiconductor layers of the semiconductor chip are preferably based upon a III-V compound semiconductor material. The semiconductor material can preferably be based on a nitride compound semiconductor material. As used herein, the phrase "based on a nitride semiconductor compound material" means that the semiconductor layer sequence or at least one layer thereof includes a III-nitride semiconductor compound material, preferably $In_xAl_yGa_{1-x-y}N$, with $0 \leq x \leq 1$, $0 \leq y \leq 1$ and $x+y \leq 1$.

In this case, this material does not necessarily have to have a mathematically exact composition of the above formula. It may rather comprise one or multiple dopants as well as additional constituents which do not essentially change the characterizing physical properties of the $IN_xAl_yGa_{1-x-y}N$ material. However, for the sake of simplicity, the above formula only includes the essential components of the crystal lattice (In, Al, Ga, N) even if these may partially be replaced by small amounts of further substances.

The optoelectronic semiconductor chip includes an active layer with at least one p-n-junction and/or with one or multiple quantum well structures. During operation of the semiconductor chips, electromagnetic radiation is generated in the active layer. Preferably, a wavelength of the radiation is in the ultraviolet and/or visible range, in particular in wavelengths between 420 nm and 680 nm inclusive, e.g., between 440 nm and 480 nm inclusive.

According to at least one embodiment, the optoelectronic semiconductor chip is a light emitting diode, LED for short. In this case, the semiconductor chip is preferably configured to emit blue light or white light.

According to at least one embodiment, the p-doped semiconductor layer is electrically contacted by means of a p-type connection contact. In other words, the p-type connection contact forms the p-type contact of the optoelectronic semiconductor chip. The p-type connection contact can comprise a bond pad and/or one or multiple contact webs, for example.

In particular, the p-type connection contact can be arranged within a trench within the semiconductor layers, e.g., of the n-doped and/or p-doped semiconductor layer. As an alternative or in addition, the p-type connection contact can be arranged on the radiation exit surface of the optoelectronic semiconductor chip. As used herein, the phrase "on the radiation exit surface" means that the p-type connection contact is arranged in direct or indirect electric and/or mechanic contact above the radiation exit surface. The term "radiation exit surface" particularly relates to the main radiation side perpendicular to the growth direction of a semiconductor layer sequence of the semiconductor chip.

According to at least one embodiment, a trench is arranged below the p-type connection contact. The trench at least partially extends into the p-doped semiconductor layer. In particular, the trench extends from the p-doped semiconductor layer via the active layer into the n-doped semiconductor layer. The fact that the trench at least partially extends into the corresponding semiconductor layer means that at least a sub-region, in particular a base area of the trench, protrudes into this corresponding semiconductor layer. In particular, the trench can extend all the way to a substrate, on which the p-doped and n-doped semiconductor layer sequences are arranged. In particular, the trench extends into the substrate. For example, the trench extends up to a maximum of 5 µm into the substrate.

The trench may have a depth of greater than or equal to 50 nm and smaller than or equal to 15 µm. In the case that the trench extends all the way into the n-doped semiconductor layer, the trench may have a depth of 100 nm to 3000 nm. If the trench extends all the way to the substrate, the trench may have a depth of 6 to 15 µm, e.g., 9 µm. As used herein, the term "trench" relates to a recess in the optoelectronic semiconductor chip that has a width/length ratio of at least 1:5, in particular 1:10 or 1:15. The trench can be generated in the semiconductor layers by means of dry-chemical etching.

In particular, the trench is a mesa trench, i.e., a deep trench etched until into the n-semiconductor layer.

According to at least one embodiment, the p-type connection contact has a maximum height in the cross-section. In particular, the p-type connection contact is arranged within the trench up to half of its maximum height, in particular two thirds of its maximum height. In other words, the p-type connection contact projects from the trench at maximum by one half to one third of its maximum height. In particular, the p-type connection contact is arranged completely within the trench. This effects that the p-type connection contact is hidden in the trench and thus can be protected from mechanical damage during the production.

As an alternative, the p-type connection contact may have a maximum height in the cross-section, wherein the p-type connection contact projects beyond the trench by at maximum two thirds of this maximum height.

According to at least one embodiment, the optoelectronic semiconductor chip comprises a transparent, electrically-conductive layer. In particular, the transparent electrically-conductive layer is arranged between the p-doped semiconductor layer and the p-type connection contact. In particular, the transparent electrically-conductive layer is connected in direct electrical contact with the p-doped semiconductor layer and the p-type connection contact. In particular, the transparent electrically-conductive layer is arranged directly, i.e., in direct mechanical contact, on the p-doped semiconductor layer. As used herein, the term "direct" means that the layers or elements are arranged directly in direct mechanical and/or electrical contact on the other layer or the other element.

In particular, the transparent electrically-conductive layer extends over the p-doped semiconductor layer in a lateral direction next to the blocking element and over the blocking element within the trench. In this way, the p-type connection contact and the p-doped semiconductor layer is connected without the p-type connection contact being directly adjacent to the p-doped semiconductor layer.

The transparent, electrically-conductive layer can be transmissive for emitted radiation. The transparent electrically-conductive layer may cover a comparatively large portion of the p-doped semiconductor layer outside the blocking element. Preferably, the transparent electrically-conductive layer covers the major part of the p-doped semiconductor layer or is applied on to the p-doped semiconductor layer even over the entire surface, except for the region of the blocking element. In this way, a good current expansion is achieved in the semiconductor layer sequence. The transparent electrically-conductive layer preferably contains a Transparent Conductive Oxide (TCO), such as ITO, for example.

Transparent electrically-conductive oxides (TCO) are transparent, electrically-conductive materials, usually metal oxides such as zinc oxide, tin oxide, cadmium oxide, titanium oxide, indium oxide, indium tin oxide (ITO) or aluminum zinc oxide (AZO). Besides binary metal oxide compounds, such as $ZnO$, $SnO_2$ or $In_2O_3$, even ternary metal oxide compounds such as $Zn_2SnO_4$, $CdSnO_3$, $ZnSnO_3$, $MgIn_2O_4$, $GaInO_3$, $Zn_2In_2O_5$, or $In_4Sn_3O_{12}$ or mixtures of different transparent conductive oxides count among the group of TCOs. Furthermore, the TCOs do not necessarily correspond to a stoichiometric composition and can also be p-doped or n-doped.

According to at least one embodiment, the transparent, electrically-conductive layer is molded over the blocking element. In this configuration, the p-type connection contact can be arranged on top of the blocking element at least in areas, wherein the transparent, electrically-conductive layer is mechanically directly adjacent the p-type connection contact and the blocking element.

According to at least one embodiment, the optoelectronic semiconductor chip comprises a blocking element arranged between the p-doped semiconductor layer and the p-type connection contact. The blocking element is arranged within the trench and extends at least partially into the p-doped semiconductor layer.

According to at least one embodiment, the blocking element at least partially extends on the p-doped semiconductor layer. Preferably, the blocking element covers the trench edges, namely the transition region from the radiation exit surface of the p-type semiconductor layer into the interior of the trench.

As used herein, the fact that a layer or an element is arranged or applied or extends on (to) or over another layer or another element can mean that the layer or the element is directly arranged on the other layer or other element in direct mechanical and/or electric contact. Furthermore, it can also mean that the one layer or the one element is indirectly arranged on or over the other layer or the other element. In this case, other layers and/or elements can be arranged between one and the other layer or between one and the other element.

According to at least one embodiment, the blocking element, the transparent, electrically-conductive layer and the p-type connection contact are at least partially arranged within the trench. In particular additionally, the blocking element and the electrically-conductive layer at least partly, i.e., partially, extend on the p-doped semiconductor layer. As used herein, the phrase "at least partially arranged within the trench" means that sub-regions of elements or layers are arranged within the trench, with other sub-regions of the element or of the layer located outside the trench.

According to at least one embodiment, the p-type connection contact and/or the blocking element do not project beyond the trench, viewed in the cross-section. In particular, the p-type connection contact is arranged completely in the trench. In other words, the p-type connection contact "hides" within the trench and thus does not project beyond the radiation exit surface of the p-doped semiconductor layer. In this way, the "buried" p-type connection contact can be protected against mechanical damage during the production. Furthermore, the side surfaces of the "buried" p-type connection contact are at least partially or completely covered by the blocking element, which particularly covers the side flanks of the trench. This advantageously allows significantly reducing the absorption, in particular in the blue wavelength range.

According to at least one embodiment, the blocking element extends all the way until into the n-doped semiconductor layer within the trench.

According to at least one embodiment, the trench has a trapezoid shape in the cross-sectional view. In particular, the trench is potted with the blocking element. This allows for producing a blocking element that has a large thickness in the cross-section. This is particularly advantageous in p-type connection contacts having a high absorption coefficient, e.g., rhodium compared to silver, since this high absorption coefficient can easily be compensated with a thick blocking element. As used herein, the fact that "blocking element is potted with the trench" can mean that the trench is at least partly filled with the blocking element. In particular, the trench can be filled completely with the blocking element. "Potted" can in particular also mean that at least the side flanks and the base area of the trench are covered with the blocking element. In particular, individual layers of the blocking element are deposited until the trench is at least partially filled with the blocking element.

As an alternative, the blocking element can be formed as a layer. The layer may have a uniform layer thickness at least within the trench. The uniform layer thickness may have a value of 80 nm to 1000 nm, e.g., 300 nm. In particular, the trench comprises side flanks and a base area, wherein in this case the blocking element as a layer directly covers both the side flanks and the base area of the trench. In particular, the transparent, electrically-conductive layer can be arranged directly behind at least within the trench. The p-type connection contact can be arranged within the trench. In particular, the trench can be potted with the p-type connection contact and be in direct contact with the transparent electrically-conductive layer. As an alternative or in addition, the p-type connection contact can be formed as a metal web and be in direct contact with the transparent, electrically-conductive layer. According to at least one embodiment, the blocking element comprises at least three layers. At least a first dielectric layer is formed from a first dielectric material with a refractive index n1. At least a second dielectric layer is formed from a second dielectric material with a refractive index n2>n1. The first dielectric material advantageously has a low refractive index, preferably n1≤1.7, and the second dielectric material has a high refractive index n2>1.7, preferably n2>2. The blocking element functions as an interference layer system, the reflection-increasing effect of which is based on multiple reflections at the interfaces between the dielectric layers with the different refractive indexes n1, n2.

According to at least one advantageous embodiment, the active laser is suitable to emit radiation with a dominant wavelength λ, wherein $0.01\lambda/4 \leq n1*d1 \leq 10\lambda/4$ is true for the thickness d1 of the at least one first dielectric layer, and $0.01\lambda/4 \leq n2*d2 \leq 10\lambda/4$ is true for the thickness d2 of the at least one second dielectric layer. Preferably, $0.5\lambda/4 \leq n1*d1 \leq 5\lambda/4$ and $0.5\lambda/4 \leq n2*d2 \leq 5\lambda/4$ apply.

As an alternative, the blocking element may comprise at least three layers, wherein the at least one first dielectric layer is the lowest layer, i.e., the layer of the blocking element directly downstream the corresponding semiconductor layer. For the thickness d1 of the first dielectric layer, the following applies: $n1*d1=3\lambda/4$ or $n1*d1=5\lambda/4$. For the following layers, e.g., for the second dielectric layer, $d2:n2*d2=1\lambda/4$ applies for the thickness.

In a preferred embodiment, $0.7\lambda/4 \leq n1*d1 \leq 1.3\lambda/4$ applies to the thickness of the at least one first dielectric layer, and $0.7\lambda/4 \leq n2*d2 \leq 1.3\lambda/4$ applies to the thickness of the at least one second dielectric layer. In this case, the optical thickness n1*d1 of the first dielectric layer and the optical thickness n1*d1 of the second dielectric layer are approximately equal to a quarter of the dominant wavelength. This is one possibility to achieve high reflection through interference in the blocking element.

According to at least one embodiment, the blocking element is formed as an individual layer. As an alternative, the blocking element can be formed as a layer sequence, in particular a Distributed Bragg Reflector (DBR) mirror. A DBR mirror contains a periodic sequence of layer pairs, which each comprise a first dielectric layer with a refractive index n1 and a second dielectric layer with a refractive index n2>n1. In this concept, the layer thickness of the blocking element is not limited, since overmolding a subsequent transparent, electrically-conductive layer is not critical.

According to at least one embodiment, the blocking element is formed as a multilayer having a high reflection coefficient. In this case, the absorption coefficient of the p-type connection contact does not have a significant impact on the brightness of the LED and a metal can be used for the p-type connection contact, which has a low electric sheet resistance and/or a low electric series resistance, e.g., gold, copper, titanium or a gold copper alloy.

According to at least one embodiment, the blocking element contains or consists of at least one of the materials $Al_2O_3$, $Ta_2O_5$, $ZrO_2$, $ZnO$, $SiN_x$, $SiO_xN_y$, $SiO_2$, $TiO_2$, $ZrO_2$, $HfO_2$, $Nb_2O_5$, or $MgF_2$. The blocking element can be deposited, e.g., by atomic layer deposition (ALD) or by a chemical vapor deposition (CVD) process, in particular plasma enhanced chemical vapor deposition, PECVD for short. In this process, first the blocking element is applied on to the p-doped semiconductor layer sequence preferably over the entire surface and then patterned using a resist mask, which is used as an etching mask, by means of an etching process.

As an alternative, the blocking element can be applied by sputtering or vapor deposition, for example. In this case, pattering is effected by a lift-off process, in which the blocking element is deposited in a window of a mask layer and the material deposited on to the mask layer is lifted-off with the mask layer.

According to at least one embodiment, the lateral extent of the trench is least partially greater than the lateral extent of the p-doped connection contact in a lateral view or a cross-section.

According to at least one embodiment, the lateral extent of the blocking element is preferably greater than the lateral extent of the p-type connection contact. Preferably, the lateral extent of the blocking element is greater than the lateral extent of the p-type connection contact by 20 μm at the most, in particular between 8 μm to 15 μm, or preferably by 12 μm at the most.

In a method for producing the optoelectronic semiconductor chip, first the blocking element may be applied on to the p-doped semiconductor layer over the entire surface, and later be patterned photolithographically in conjunction with an etching process. In this case, at least the side flanks and the base area of the trench are covered with the blocking element. In particular, even sub-regions of the p-semiconductor layer leading out of the trench are coated with the blocking element.

According to at least one embodiment, the blocking element is electrically insulated. In particular, a direct current flow between the p-type connection contact and the p-doped and/or n-doped semiconductor layers and/or the active layer is prevented by the blocking element. In other words, no direct current flow of the p-type connection contact, i.e., in particular perpendicular in the cross-sectional view in the direction of the semiconductor layer sequence, is possible due to the blocking element.

According to at least one embodiment, the optoelectronic semiconductor chip comprises an n-type connection contact. The n-type connection contact electrically contacts the at least one n-doped semiconductor layer. In particular, a second transparent, electrically-conductive layer can be arranged between the n-doped semiconductor layer and the n-type connection contact. In this case, the n-type connection contact is not electrically connected to the semiconductor material of the n-doped semiconductor layer via a direct metal semiconductor contact, but advantageously via the second transparent electrically-conductive layer. In this way, the formation of a Schottky-barrier is counteracted, which in particular occurs in metals having a high electron affinity such as gold, rhodium, platinum or palladium, on an n-doped nitride semiconductor compound material and leads to an increase of the operating voltage. As an alternative, the second transparent, electrically-conductive layer can be the transparent, electrically-conductive layer.

According to at least one embodiment, the p-type connection contact and/or the n-type connection contact comprises at least one of the metals gold, silver, titanium, platinum, palladium, copper, nickel, indium, rhenium, rhodium, tungsten, chromium, or aluminum. The p-type and/or n-type connection contact can be deposited, e.g., by vaporization or sputtering.

Particularly preferably, the p-type and/or n-type connection contact comprises gold, aluminum, rhenium, rhodium, copper, titanium, or an alloy with at least one of these metals, e.g., a cold copper alloy.

According to at least one embodiment of the invention, the optoelectronic semiconductor chip can comprise a second trench. In this case, the same definitions and specifications as in the above-described trench regarding geometry and the configuration of the second trench apply. The second trench can be arranged below an n-type connection contact. In particular, the second trench is at least partially arranged below an n-type connection contact. The second trench extends at least partially through the p-doped semiconductor layer via the active layer into the n-doped semiconductor layer. In particular, a second blocking element is arranged between the n-doped semiconductor layer and the n-type connection contact. In this case, the same specifications as for the above-described blocking element apply to the second blocking element. The second blocking element may at least partially be arranged within the second trench.

According to at least one embodiment, the optoelectronic semiconductor chip includes at least one n-doped semiconductor layer, at least one p-doped semiconductor layer and an active layer arranged between the at least one n-doped semiconductor layer and the at least one p-doped semiconductor layer. The n-doped semiconductor layer is electrically contacted by means of an n-type connection contact. A trench, hereinafter referred to as second trench, is arranged below the n-type connection contact. The second trench at least partially extends into the n-doped semiconductor layer. A blocking element, hereinafter referred to as the second blocking element, is arranged between the p-doped semiconductor layer and/or the n-doped semiconductor layer and the n-type connection contact. The second blocking element is at least partially arranged within the second trench. The second blocking element is electrically insulating. The trench has side flanks, which are covered with the blocking element, in particular directly covered. The blocking element comprises at least three layers, which comprise at least one first dielectric layer of a first dielectric material with a refractive index n1 and at least one second dielectric layer of a second dielectric material with a refractive index n2>n1, wherein the active layer is configured to emit radiation with a dominant wavelength λ, wherein $n1*d1 \geq 0.7\lambda/4$ applies to the thickness d1 of the at least one first dielectric layer and $n2*d2 \geq 0.7\lambda/4$ applies to the thickness d2 of the at least one second dielectric layer.

In particular, $0.7\lambda/4 \leq n1*d1 \leq 1.3\lambda/4$ and $0.7\lambda/4 \leq n2*d2 \leq 1.3\lambda/4$ applies.

According to at least one embodiment, the second blocking element can also be completely arranged within the second trench. As used herein, completely means that the second blocking element does not project beyond the radiation exit surface of the p-type semiconductor layer sequence in a cross-sectional view.

According to at least one embodiment, the optoelectronic semiconductor chip comprises a passivation layer. The passivation layer covers, in a lateral extent, at least the p-type connection contact and the blocking element. As an alternative or in addition, the passivation layer may cover at least the n-type connection contact and the second blocking element in a lateral extent. Thus, the passivation layer protects the n-type and/or p-type connection contact against external influence, e.g., air moisture. In particular, the passivation layer is formed of silicon dioxide. Silicon dioxide is insulating, cost-effective, stable and transparent.

According to at least one embodiment, at least partly a transparent, electrically-conductive interlayer is arranged between the p-doped semiconductor layer and the blocking element. In particular, the transparent, electrically-conductive interlayer is also in regions arranged between the transparent electrically-conductive layer and the p-doped semiconductor layer. The transparent electrically-conductive interlayer covers the p-doped semiconductor layer preferably over the entire surface thereof. In particular, the transparent electrically-conductive interlayer ends into the trench at the transition between the p-doped semiconductor layer. In other words, the interlayer covers only the surface of the p-doped semiconductor layer sequence, but not the side flanks and/or the base area of the trench.

The transparent, electrically-conductive interlayer can at least in regions and partially be directly adjacent the transparent, electrically-conductive layer. In other regions, the blocking element can be arranged directly after the transparent, electrically-conductive interlayer, and the transparent, electrically-conductive layer can be arranged directly after the blocking element. For example, it is possible for the transparent, electrically-conductive layer to overmold the blocking element so that it is partially adjacent the transparent, electrically-conductive interlayer laterally next to the blocking element. In this way, an electrically-conductive connection between the p-type connection contact and the transparent, electrically-conductive interlayer is formed.

According to at least one embodiment, the p-type and/or n-type connection contact is encapsulated. In particular, the p-type and/or n-type connection contact is encapsulated by a barrier layer. A further encapsulation layer can be arranged downstream, which projects beyond both the second blocking element and/or blocking element and the p-type and/or n-type connection contact. In other words, the barrier layer encapsulates the p-type and/or n-type connection contact and the further encapsulation layer encapsulates both the second blocking element and/or blocking element and the p-type and/or n-type connection contact. In particular, the p-type and/or n-type connection contact is formed of gold, copper, silver, rhodium or rhenium.

The inventors have found that the by the use of a trench in a semiconductor layer sequence, the blocking element can be formed there. As a result, a higher layer thickness of the blocking element can be generated there. In addition, as alternative or in addition, the p-type and/or n-type contact can be formed within the trench. In particular, the p-type and/or n-type connection contact can be hidden within the trench. As a result, the connection contacts can be protected from mechanical damage during the production. Furthermore, this leads to a cost reduction, since an additional passivation of the connection contacts can be dispensed with. A further effect is that the absorption at the side surfaces of the "buried" connection contacts, in particular in the blue wavelength range, can be significantly reduced by arranging the p-type and/or n-type connection contacts within the trench.

BRIEF DESCRIPTION OF THE DRAWINGS

Further advantages, advantageous embodiments and developments result from the exemplary embodiments described in conjunction with the Figures.

The figures show in:

FIG. 1 is a schematic plan view and side view of an optoelectronic semiconductor chip according to a comparative example;

FIGS. 2 to 4 are schematic side views of an optoelectronic semiconductor chip 100 according to one embodiment; and Each of the FIGS. 5 to 15 shows a schematic side view of an optoelectronic semiconductor chip according to one embodiment.

DETAILED DESCRIPTION OF ILLUSTRATIVE EMBODIMENTS

Figure 5:
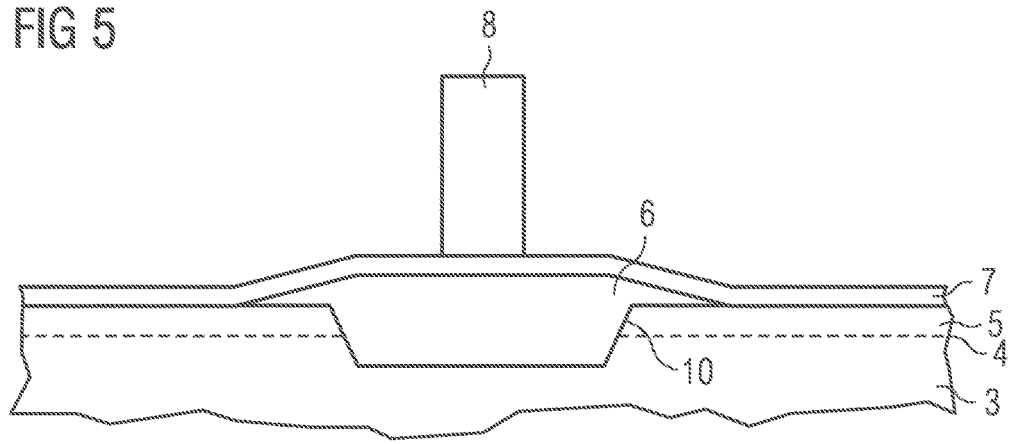

FIG. 1 shows a schematic side view and a plan view of an optoelectronic semiconductor chip according to a comparative example. The optoelectronic semiconductor chip comprises a substrate 1. An n-doped semiconductor layer 3, an active layer 4, and a p-doped semiconductor layer 5 are arranged downstream the substrate 1. A blocking element 6 is arranged downstream the p-doped semiconductor layer 5. The blocking element 6 is arranged on the radiation exit surface of the p-doped semiconductor layer 5. An electrically-conductive layer 7 is arranged downstream the blocking element 6. A p-type connection contact is arranged downstream the transparent, electrically-conductive layer 7 is. Thus, the transparent electrically-conductive layer 7 electrically connecting the p-type connection contact 8 and the p-doped semiconductor layer 5 is arranged between the p-type connection contact 8 and the p-doped semiconductor layer 5. Generally, the transparent, electrically-conductive layer 7 has a thin layer thickness of approx. 100 nm. When overmolding the blocking element 6 with this transparent, electrically-conductive layer 7, a tapering of the transparent, electrically-conductive layer 7 occurs on the edges of the blocking element 6 (illustrated by the circle 18). This causes that a higher current density is generated in these places. This leads to material damages during operation.

FIG. 2 shows a schematic side view of an optoelectronic semiconductor chip 100 according to one embodiment. The optoelectronic semiconductor chip 100 comprises a substrate 1. Preferably, the substrate 1 is a substrate suitable for growing a nitride semiconductor compound material. In particular, the substrate 1 can be a sapphire substrate. As an alternative, the substrate may comprise Si, SiC or GaN, for example.

A buffer layer 2 is arranged downstream the substrate 1. The buffer layer 2 can consist of, e.g., aluminum gallium nitride, gallium nitride and/or aluminum nitride or comprise these materials. An n-doped semiconductor layer 3 is arranged downstream the buffer layer 2. An active layer 4, which in particular is a radiation-emitting active layer, is arranged downstream the n-doped semiconductor layer 3.

For example, the active layer 4 can be formed as a p-n junction as a double hetero structure, as a single quantum well structure or multi quantum well structure, for example. In this case, the term quantum well structure includes every structure in which charge carriers receive a quantization of their energy states by confinement.

In particular, the term quantum well structure does not include any information on the dimension of the quantization. Thus, it includes, inter alia, quantum wells, quantum wires and quantum dots and any combination of these structures.

A p-doped semiconductor layer 5 is directly downstream the active layer 4. At least the p-doped semiconductor layer 5 comprises a trench 10. In particular, the trench may extend via the p-doped semiconductor layer 5 through the active layer 4 into the n-doped semiconductor layer 3. The trench 10 is arranged below a p-type connection contact 8. The p-type connection contact 8 and the p-doped semiconductor layer 5 are electrically contacted. In particular, both layers are electrically contacted via a transparent, electrically-conductive layer 7, which is applied on to the regions of the trench 10 on the p-doped semiconductor layer 5 in particular over the entire surface. The transparent, electrically-conductive layer 7 includes or consists of indium tin oxide, in particular.

A blocking element 6 is arranged within the trench 10. The blocking element 6 fills the trench completely. The blocking element 6 is electrically insulating. The blocking element 6 prevents a direct, i.e., in particular a vertical current flow between the p-type connection contact and the p-type and/or n-doped semiconductor layers 3, 5 and the active layer 4.

In the cross-section, the trench 10 can be formed in the shape of a rectangle or a trapezoid. Due to the arrangement of the blocking element 6 within the trench 10, a thicker blocking element 6 can be used, compared to a blocking element 6, which is arranged on the radiation exit surface of the p-semiconductor layer 5 as in FIG. 1. This increases reflection into the semiconductor layers and reduces the absorption below the p-type connection contact.

Arranging the blocking element 6 within the trench 10 allows for arranging the transparent, electrically-conductive layer 7 on the p-doped semiconductor layer 5 in a homogenous and uniform manner. As a result, no increased current densities are generated on the edges of the blocking element and thus material damages are prevented during operation.

Furthermore, the optoelectronic semiconductor chip 100 comprises an n-type connection contact 9. The n-type connection contact 9 contacts at least the one n-doped semiconductor layer 3. The p-type connection contact 8 and the n-type connection contact 9 are in particular metal layers comprising at least one metal or at least one metal alloy. It is also possible that that the p-type connection contact 8 and/or the n-type connection contact 9 is formed of multiple sub-layers of different metals or metal alloys. In particular, the n-type and/or p-type connection contact is selected from the metals gold, silver, titanium, aluminum, or copper. These metals can be deposited by means of vapor deposition or sputtering.

The p-type connection contact 8 is advantageously not directly adjacent to the p-doped semiconductor layer 5. Rather, the p-type connection contact 8 is electrically-conductively connected to the p-doped semiconductor layer 5 by the transparent, electrically-conductive layer 7. Due to the transparence of the electrically-conductive layer 7 for the emitted radiation of the active layer 4, the electrically-conductive layer 7 can advantageously cover a large region of the surface of the p-doped semiconductor layer 5 and, in this way, generate a good current expansion in the semiconductor layer sequence 3, 4, 5.

Preferably, the transparent, electrically-conductive layer 7 covers at least half of the surface of the p-doped semiconductor layer 5. The blocking element 6, which is at least partially arranged in the p-doped semiconductor layer 5, in particular has a larger lateral extent than the p-type connection contact 8. Preferably, the lateral extent of the blocking element 8 is larger than the lateral extent of the p-type connection contact by 8 μm to 12 μm.

In a method for producing the optoelectronic semiconductor chip 100, the blocking element 6 may first be applied on to the entire surface of the p-doped semiconductor layer 5 and within the trench 10 and later be patterned photolithographically in conjunction with an etching process. The trench can be generated by a dry-chemical etching method.

FIG. 3 shows a schematic side view of an optoelectronic semiconductor chip 100 according to one embodiment. The optoelectronic semiconductor chip 100 of the FIG. 3 is different compared to FIG. 2 in that the p-type connection contact 8 and the transparent, electrically-conductive layer 7 are arranged within the trench 10. The trench 10 extends at least into the p-doped semiconductor layer 5. In particular, the trench extends from the p-doped semiconductor layer 5 via the active layer 4 into the n-doped semiconductor layer 3.

As an alternative, the trench 10 may also extend all the way to the substrate 1. The blocking element 6 is arranged within the trench 10. In particular, the blocking element 6 is formed as a layer. In particular, the blocking element 6 covers the side flanks 101 as well as the base area 102 of the trench 10. Preferably, the blocking element 6 may in addition at least partially extend on the p-doped semiconductor layer 5. Within the trench 10, the transparent, electrically-conductive layer 7 is directly downstream the blocking element 6.

The transparent, electrically-conductive layer 7 extends over the side flanks 101 of the trench 10 and the base area 102 of the trench 10 also on to the p-doped semiconductor layer 5. In particular, the transparent electrically-conductive layer covers at least half of the surface of the p-doped semiconductor layer 5.

The p-type connection contact 8 is arranged within the trench 10. In particular, the p-type connection contact does not project beyond the p-doped semiconductor layer 5 in a cross-sectional view. As a result, the p-type connection contact 8 can be hidden within the trench 10 and can thus be protected against mechanical damage during the production process. The absorption not only at the lower side of the p-type connection contact 8, but also at the side surfaces of the p-type connection contact 8 is reduced by arranging the blocking element 6. Compared to the comparative example of FIG. 1, a passivation of the p-type connection contact is not required to protect it against mechanical damage during the chip process. This saves costs as the passivation on the p-type connection contact 8 can be omitted. Furthermore, the degradation during the operation of the component is prevented by providing the p-type connection contact within the trench and by a lack of damage to the said p-type connection contact.

FIG. 4 shows a schematic side view of an optoelectronic semiconductor chip 100 according to one embodiment. The optoelectronic semiconductor conductor chip 100 of FIG. 4 is different from the optoelectronic semiconductor chip 100 of FIG. 3 in that a second trench 12 is present. The second trench 12 extends through the p-doped semiconductor layer 5 into the n-doped semiconductor layer 3. The n-type connection contact 9 is arranged within the second trench 12. A second blocking element 13 is in each case arranged on the side flanks of the trench 12. The n-type connection contact 9 is directly contacted with the n-type semiconductor layer 3. The second blocking element 13 can additionally extend on the p-type semiconductor layer 5 (not illustrated).

FIG. 5 shows a schematic illustration of a detail of an optoelectronic semiconductor chip 100 according to one embodiment. The optoelectronic semiconductor chip 100 comprises an n-doped semiconductor layer 3. Furthermore, the optoelectronic semiconductor chip 100 comprises an active layer 4 and a p-doped semiconductor layer 5. A trench 10 is arranged below a p-type connection contact 8. The trench 10 has a greater lateral extent in the side view than the p-type connection contact 8. The trench 10 extends all the way until into the n-doped semiconductor layer 3. The trench is potted with the blocking element 6. The blocking element 6 additionally projects beyond the trench 10 and at least in sections extends beyond the trench edges on to the p-doped semiconductor layer 5. The transparent, electrically-conductive layer 7 covers both the p-doped semiconductor layer 5 and the blocking element 6 and contacts the p-type connection contact 8 with the p-doped semiconductor layer 5. The trench 10 may comprise flat or deep edges.

The blocking element 6 may at least consist of a dielectric material or at least include a dielectric material. The blocking element 6 can also be formed as a layer. The blocking element 6 can be formed as a single layer or as a multilayer structure.

An optoelectronic semiconductor chip 100 according to FIG. 5 provides the advantage that a thick blocking element 6 can be used. The reflection coefficient can be increased thereby. The transparent, electrically-conductive layer 7, which includes or consists of in particular p-doped ITO, covers the blocking element 6 in a uniform manner. As a result, increased current densities will not be generated on the edges of the blocking element 6 due to the tapering of a transparent, electrically-conductive layer 7, as is the case in the comparative example of FIG. 1. Thus, material damages do not occur during the operation of the optoelectronic semiconductor chip.

Figure 6:
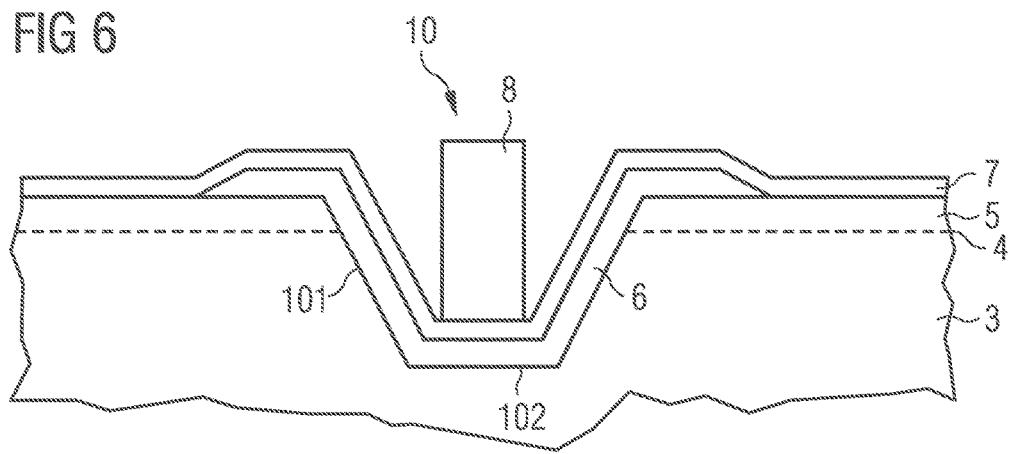

FIG. 6 shows a schematic side view of a detail of an optoelectronic semiconductor chip 100 according to one embodiment. The detail of FIG. 6 essentially corresponds to the optoelectronic semiconductor chip 100 of FIG. 3, wherein in this case, the p-type connection contact 8 projects beyond the radiation exit surface of the p-doped semiconductor layer 5. However, in particular, the p-type connection contact projects beyond the trench by up to one third of its maximum height in a cross-sectional view. In other words, in this case, an optoelectronic semiconductor chip 100 is provided, which comprises a buried n-type connection contact 8.

In this way, the p-type connection contact can be protected from mechanical damage during the production. In addition, by arranging the blocking element 6, the reflection coefficient can be increased and the absorption at the lower side and the side surfaces or edges of the p-type connection contact can be reduced.

Figure 7:
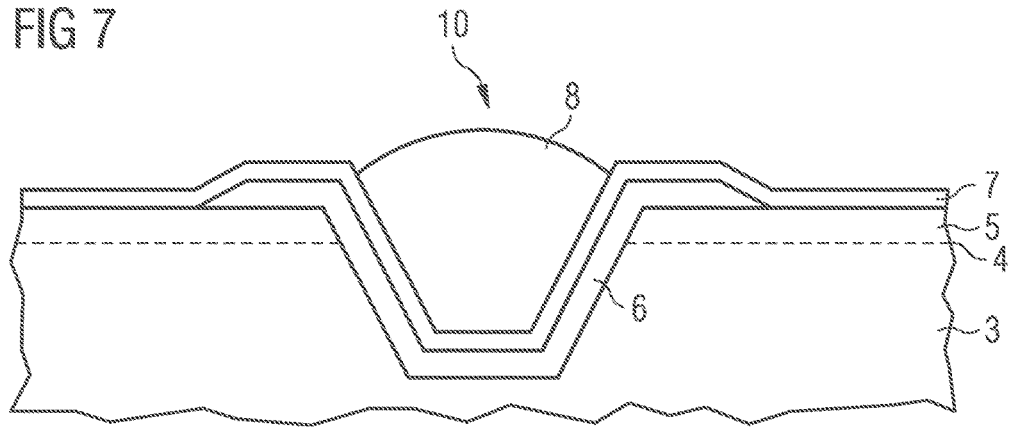

FIG. 7 shows a schematic illustration of a detail of an optoelectronic semiconductor chip 100 according to one embodiment. FIG. 7 is different from the optoelectronic semiconductor chip 100 of FIG. 6 in that the p-type connection contact 8 is not formed to be rectangular, but formed as a potting within the trench 10. The p-type connection contact can project beyond the transparent, electrically-conductive layer 7. In particular, the p-type connection layer 8 does not project beyond the transparent, electrically-conductive layer 7.

As a result, an optoelectronic semiconductor chip 100 can be provided, which is "hidden" in the trench and can thus be protected from mechanical damages on the wafer during the production. The blocking element 6 increases the reflection coefficient and thus reduces the absorption not only below the base area of the p-type connection contact 8, but also on the side surfaces of the p-type connection contact 8. Compared to FIG. 6, the side surfaces of the p-type connection contact 8 comprise a direct electric and/or mechanical contact to the transparent, electrically-conductive layer 7 within the trench. The sheet resistance can be reduced thereby.

According to at least one embodiment, in a cross-sectional view, the p-type connection contact has a trapezoidal shape or an inverse cake-box shape.

Figure 8:
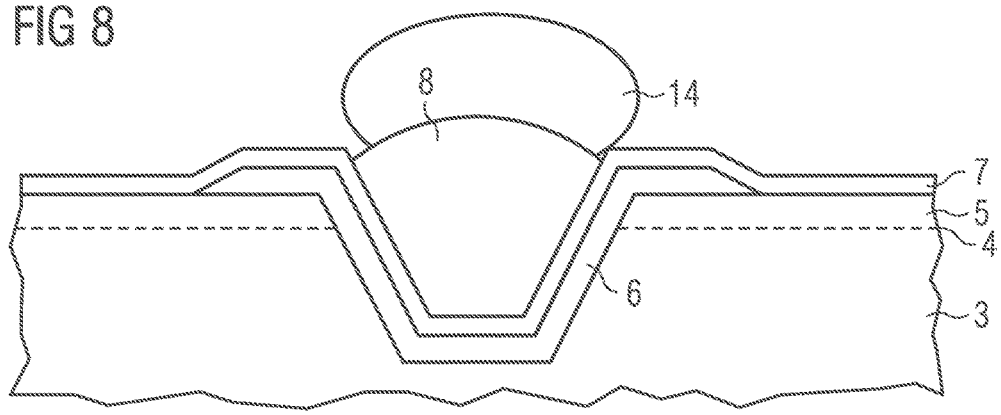

FIG. 8 shows a schematic illustration of a detail of an optoelectronic semiconductor chip 100 according to one embodiment. FIG. 8 is different from FIG. 7 in that a p-type bond ball is downstream the p-type connection contact. In particular, the p-bond ball has a direct electric and/or mechanical contact to the transparent, electrically-conductive layer 7 and the p-type connection contact 8. As a result, the p-type bond pad surface and thus the absorbing metal volume can be reduced in the optoelectronic semiconductor chip 100. In particular, the p-type bond ball is not symmetrically but asymmetrically arranged to the axis of symmetry of the trench. This means that in particular the p-type bond ball is in direct mechanical contact with at least one side surface of the transparent, electrically-conductive layer 7. When the p-type bond ball is oriented asymmetrically, the shear force is not critically reduced because the p-type bond ball is supported by at least the transparent, electrically-conductive layer 7.

Figure 9:
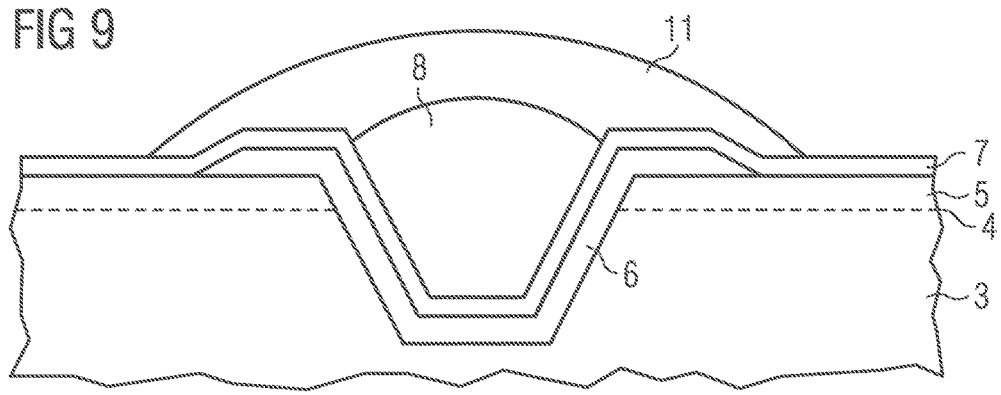

FIG. 9 shows a schematic side view of an optoelectronic semiconductor chip 100 according to one embodiment. FIG. 9 is different from FIG. 7 in that the optoelectronic semiconductor chip 100 additionally comprises a passivation 11. The passivation 11 is in particular arranged locally and thus extends over the p-type connection contact 8. The passivation 11 consists of or includes at least one dielectric material, e.g., silicon dioxide. The passivation 11 can be formed as a single layer or be composed of multiple layers. In particular, the multiple layers have different refractive indices in the vertical direction. By the use of a passivation 11, absorption at the surface of the p-type connection contact can be reduced as well.

Figure 10:
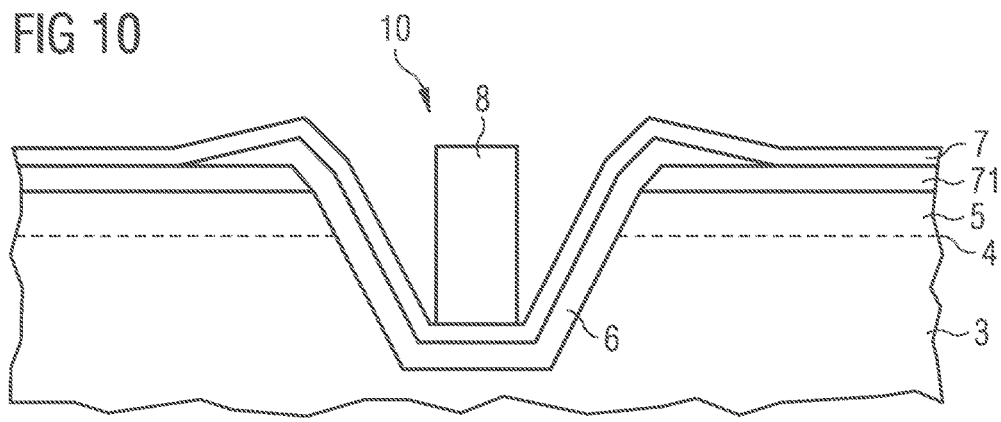

FIG. 10 shows a schematic side view of a detail of an optoelectronic semiconductor chip 100 according to one embodiment. The optoelectronic semiconductor chip 100 of FIG. 10 is different from the optoelectronic semiconductor chip of FIG. 6 in that it comprises an additional transparent, electrically-conductive interlayer 71. In particular, the transparent, electrically-conductive interlayer 71 is arranged on the p-doped semiconductor layer 5. In particular, the p-doped semiconductor layer 5 and the transparent electrically-conductive interlayer 71 are directly electrically and/or mechanically contacted with one another. In particular, the transparent, electrically-conductive interlayer 70 reaches as far as the trench edges of the trench 10. In particular, the transparent, electrically-conductive interlayer 81 is not arranged within the trench 10. The blocking element 6 can, as shown in FIG. 10, cover the side flanks of the and base area of the trench 10 and additionally at least partially extend on the transparent, electrically-conductive interlayer 71. The transparent, electrically-conductive layer 7 can be arranged within the trench 10 on the blocking element 6.

In particular, the optoelectronic semiconductor chip 100 comprises, in the region of the trench edges, a layer sequence in the direction of the radiation exit of n-doped semiconductor layer 3, active layer 4, p-doped semiconductor layer 5, transparent, electrically-conductive interlayer 71, blocking element 6 and transparent, electrically-conductive layer 7.

In particular, the transparent, electrically-conductive interlayer 71, the blocking element 6 and the transparent, electrically-conductive layers 7 are in direct mechanical contact with one another. The use of a transparent, electrically-conductive interlayer 71 causes that the transparent, electrically-conductive layer 7 can be contacted to the p-doped semiconductor layer in a good manner without generating a large electric resistance.

The contact surface between the p-type connection contact 8 and the transparent, electrically-conductive layer 7 is strongly increased and thus the sheet resistance is reduced. The blocking element 6 also increases the reflection coefficient due to its configuration and thereby reduces absorption at the side surfaces of the p-type connection contact 8. Furthermore, the p-type connection contact is arranged within the trench 10 and can thus be protected against mechanical damage during the production.

Figure 11:
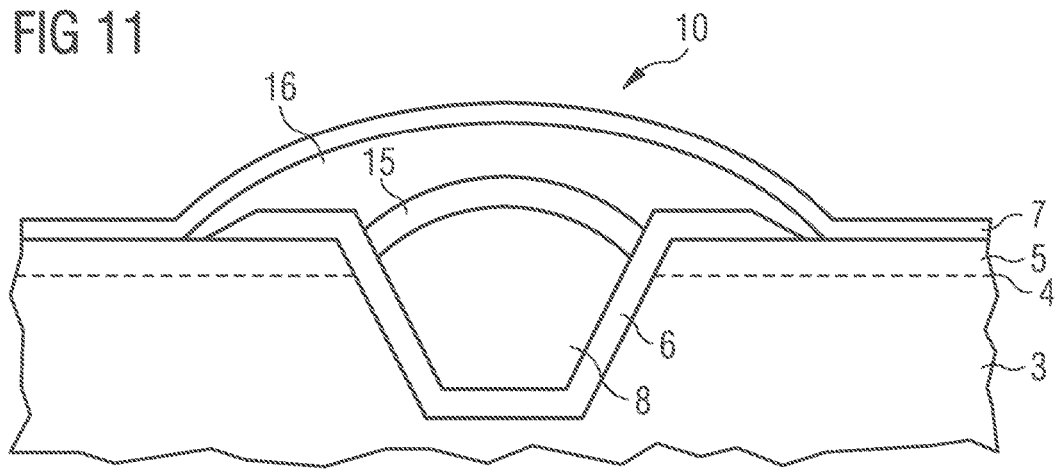

FIG. 11 shows a schematic illustration of a detail of an optoelectronic semiconductor chip 100 according to one embodiment. The optoelectronic semiconductor chip 100 comprises an n-doped semiconductor layer 3, followed by an active layer 4, followed by a p-doped semiconductor layer 5. The optoelectronic semiconductor chip 100 further comprises a trench 10, which extends via the p-doped semiconductor layer 5 via the active layer 4 into the n-doped semiconductor layer 3.

In addition, the blocking element 6 can be formed as a layer and cover the p-doped semiconductor layer 5 at least in regions. The blocking element 6 is formed as a layer within the trench and covers the side flanks and the base area of the trench 10. Within the trench 10, the p-type connection contact 8 follows the blocking element 6, which is formed as a potting and casts the trench 10. A barrier layer 15 can be arranged downstream the connection contact 8. The barrier layer 15 protects the p-type connection contact 8. An encapsulation 16 can be arranged downstream the barrier layer 15, said encapsulation projecting beyond the blocking element 6, the barrier layer 15 and the p-type connection contact 8. In particular, the encapsulation 16 terminates flush with the p-doped semiconductor layer 5 on the left side and on the right side of the trench 10. In particular, the encapsulation is formed as a layer.

A transparent, electrically-conductive layer 7 can be arranged downstream the encapsulation 16. Due to this sealing or encapsulation, metals such as silver or copper, which would otherwise exhibit electro-migration, can be used for the p-type connection contact 8. Silver has a high reflection coefficient. Copper has a low series resistance. Metals can be used for the barrier layer 15 and/or the encapsulation 16. In particular, a metal with a high reflection coefficient, such as gold, can be used for both of them. This allows providing an optoelectronic semiconductor chip 100 which comprises a p-type connection contact 8 within the trench 10 and therefore protects this contact against mechanical damage during the production. The blocking element 6 reduces absorption at the side surfaces of the p-type connection contact 8. If a material with a high reflection coefficient, such as silver, is used as the p-type connection contact, there is no need for the thickness of the blocking element 6 and of the semiconductor layers to be increased. If a material with a low series resistance, such as copper, is used as the p-type connection contact 8, voltage is reduced during operation. The contact surface between the p-type connection contact 8 and the transparent, electrically-conductive layer 7 is increased by an optoelectronic semiconductor chip 100 and the sheet resistance is reduced.

Figure 12:
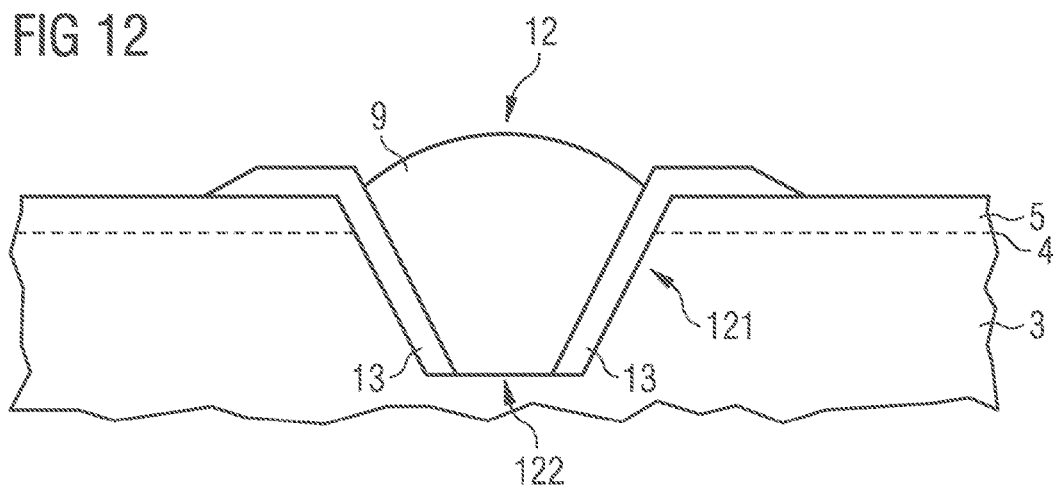

FIG. 12 shows a schematic side view of a detail of an optoelectronic semiconductor chip 100 according to one embodiment. The optoelectronic semiconductor chip 100 comprises an n-doped semiconductor layer 3, an active layer 4 and a p-doped semiconductor layer 5. The optoelectronic semiconductor chip 100 comprises a trench 12 (in the following referred to as a second trench 12), which at least partially extends into the n-doped semiconductor layer 3. The second trench 12 comprises side flanks 121 and a base area 122. An n-type connection contact 9 is arranged within the second trench 12. The second trench 12 is potted with the n-type connection contact 9. The side flanks 121 of the second trench 12 are covered with a blocking element 13 (hereinafter referred to a as a second blocking element). Here, the same materials as for the blocking element 6 can be used. In addition, the second blocking element 13 can extend on the p-doped semiconductor layer 5. The base area 122 of the second trench 12 is free of the blocking element 13. Thus, the n-type connection contact 9 is electrically-contacted at least with one n-doped semiconductor layer 3. The second trench 12 can comprise steep or flat lateral edges. The n-type connection contact 9 can be applied within the second trench 12 by means of sputtering, for example. The second trench 12 is filled with the n-type connection contact 9.

In this way, an optoelectronic semiconductor chip 100 can be provided, with the n-type connection contact 9 being hidden within the second trench 12 and therefore protected from mechanical damage during the production. The second blocking element 13 increases the reflection coefficient and therefore reduces the absorption on the side flanks of the n-type-connection contact 9.

Figure 13:
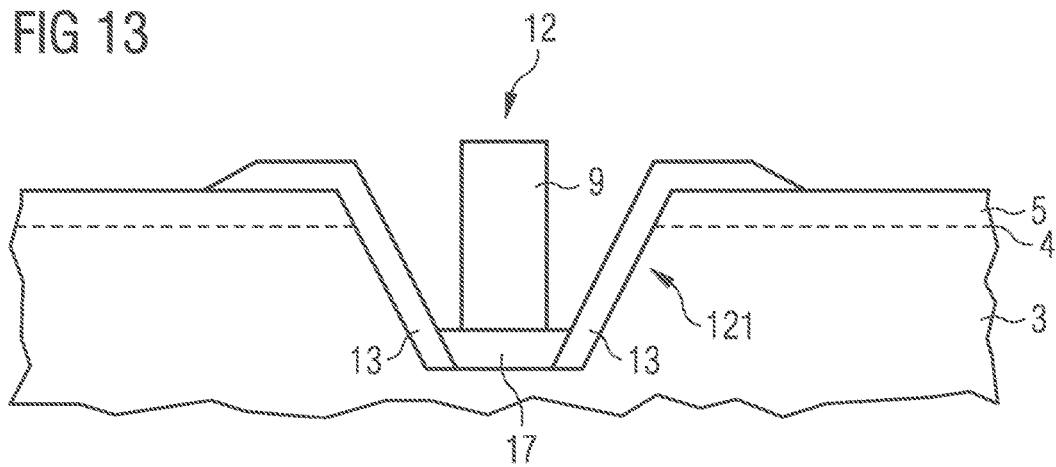

FIG. 13 shows a schematic side view of a detail of an optoelectronic semiconductor chip 100 according to one embodiment. The optoelectronic semiconductor chip 100 comprises a second trench 12, in which the n-type connection contact 9 is arranged. The side flanks 121 of the second trench 12 are covered with a second blocking element 13. The base area 122 of the second trench 12 is covered with a n-doped, transparent, electrically-conductive layer 17. The n-type connection contact 9 is directly arranged on the n-doped, transparent, electrically-conductive layer 17. Here and in the following, direct means in direct mechanical and/or electrical contact. The n-doped transparent, electrically-conductive layer 17 is an n-doped ITO layer, in particular. In addition, the second blocking element 13 can extend on to the p-doped semiconductor layer 5 on the left side and on the right side of the second trench 12. The n-type connection contact 9 can have a rectangular shape in a cross-sectional view. The n-type connection contact 9 does not exhibit direct mechanical contact to the second blocking element 13.

By means of such an arrangement, a semiconductor chip 100 can be provided, wherein the n-type connection contact 9 can be hidden within the second trench 12 and therefore be protected against mechanical damage. The second blocking element 13 increases the reflection coefficient and therefore reduces the absorption on the side surfaces or side edges of the n-type connection contact 9. The n-doped, transparent electrically-conductive layer 17 increases the n-type contact surface area for the n-type connection contact 9 and therefore reduces the sheet resistance.

Figure 14:
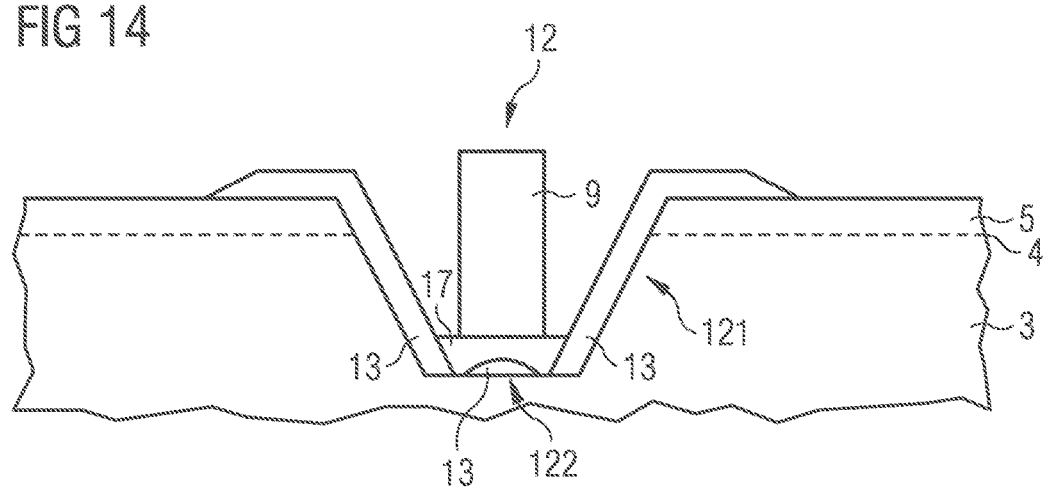

FIG. 14 shows a schematic side view of a detail of an optoelectronic semiconductor chip 100 according to one embodiment. The optoelectronic semiconductor chip 100 according to FIG. 14 differs from FIG. 13 in that additionally, a second blocking element 13 is arranged between the n-doped semiconductor layer 3 and the n-doped transparent, electrically-conductive layer 17 within the trench on the base area 122 of the second trench 12. Here, the second blocking element 13 partially or partly arranged on the base area. In other words, it does not completely cover the base area of the second trench 12. This ensures that current can still flow from the n-type connection contact 9 to the n-semiconductor layer 3.

The second blocking element 13, which is arranged on the base area 122 of the second trench 12, also increases the reflection coefficient and therefore reduces the absorption on the base area of the n-type connection contact 9. The n-doped transparent electrically-conductive layer 17 increases the n-type contact surface and thus reduces the sheet resistance.

The second blocking element 13 increases the reflection coefficient and reduces the absorption loss at the base area of the n-type connection contact 9.

Figure 15:
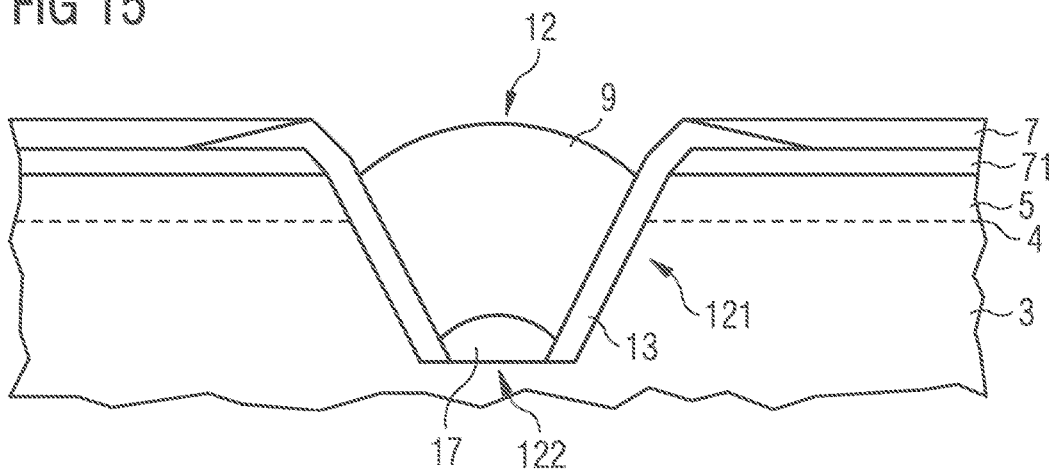

FIG. 15 shows a schematic side view of a detail of an optoelectronic component 100 according to one embodiment. The optoelectronic semiconductor component 100 comprises a semiconductor layer sequence 3, 4, 5. A second trench 12 is arranged within this semiconductor layer sequence 3, 4, 5. The second trench 12 comprises side flanks 121 and a base area 122. The side flanks are covered by a second blocking element 13. An n-type connection contact 9 is arranged within the second trench 12. The second trench 12 is potted with said n-type connection contact 9. An n-doped transparent electrically-conductive layer 17 is arranged on the base area 122 within the second trench 12. The exemplary embodiment of FIG. 15 comprises a transparent electrically-conductive layer 7, which is particularly p-doped. The exemplary embodiment of FIG. 15 further comprises a transparent, electrically-conductive interlayer 11, which is p-doped as well. In this case, the arrangement of the two layers 7 and 71 can have an analogous structure, as described with reference to FIG. 10. The n-type connection contact 9 can be arranged within the second trench 12. The second blocking element 13 increases the reflection coefficient and therefore reduces the absorption on the lateral edges of the n-type connection contact 9. The transparent, electrically-conductive layer 7 increases the contact surface area and thus reduces the sheet resistance.

The exemplary embodiments described in conjunction with the figures and the features thereof can also be combined with one another according to further exemplary embodiments, even if such combinations are not explicitly shown in the figures.

Furthermore, the exemplary embodiments described in conjunction with the figures may comprise additional or alternative features according to the description in the general part.

The invention is not limited to the exemplary embodiments by the description using these exemplary embodiments. The invention rather comprises any new feature as well as any combination of features, in particular including any combination of features in the claims, even if this feature or this combination is per se not explicitly indicated in the claims or the exemplary embodiments.

The invention claimed is:
1. An optoelectronic semiconductor chip comprising:
at least one n-doped semiconductor layer;
at least one p-doped semiconductor layer; and
an active layer arranged between the at least one n-doped semiconductor layer and the at least one p-doped semiconductor layer,
wherein the p-doped semiconductor layer is electrically contacted by a p-type connection contact,
wherein a first trench extending at least partially into the p-doped semiconductor layer is arranged below the p-type connection contact, wherein an electrically insulating first blocking element arranged at least partially below the p-type connection contact and at least partially within the first trench is arranged at least between the n-doped semiconductor layer and the p-type connection contact, wherein the electrically insulating first blocking element is configured to prevent a direct current flow between the p-type connection contact and the p-doped and n-doped semiconductor layers and the active layer, wherein the n-doped semiconductor layer is directly electrically contacted by an n-type connection contact, wherein the n-type connection contact is arranged within a second trench, wherein the second trench comprises side flanks, wherein at least the side flanks of the second trench are covered by a second blocking element, and wherein the second blocking element is electrically insulating.

2. The optoelectronic semiconductor chip according to claim 1, further comprising a transparent, electrically-conductive layer arranged between the p-doped semiconductor layer and the p-type connection contact, which are in direct electrical contact.

3. The optoelectronic semiconductor chip according to claim 2, wherein the first blocking element, the transparent, electrically-conductive layer and the p-type connection contact are at least partially arranged within the first trench, and wherein the first blocking element and the transparent, electrically-conductive layer additionally at least partially extend on the p-doped semiconductor layer.

4. The optoelectronic semiconductor chip according to claim 1, wherein the first blocking element at least partially extends on to the p-doped semiconductor layer.

5. The optoelectronic semiconductor chip according to claim 1, wherein the first blocking element extends all the way into the n-doped semiconductor layer within the first trench.

6. The optoelectronic semiconductor chip according to claim 1, wherein the first trench has a trapezoid shape in cross-section, and wherein the first trench is potted with the first blocking element.

7. The optoelectronic semiconductor chip according to claim 1, wherein the p-type connection contact has a maximum height in cross-section, and wherein the p-type connection contact projects beyond the first trench by at maximum two thirds of this maximum height.

8. The optoelectronic semiconductor chip according to claim 1, wherein in cross-section, the p-type connection contact and/or the first blocking element do not project beyond the first trench.

9. The optoelectronic semiconductor chip according to claim 1, wherein the first trench has side flanks and a base area, wherein the first blocking element is formed as a layer and directly covers both the side flanks and the base area of the first trench, wherein a transparent, electrically-conductive layer is arranged within the first trench, and wherein the p-type connection contact is arranged within the first trench.

10. The optoelectronic semiconductor chip according to claim 9, wherein the first trench is potted with the p-type connection contact and is in direct contact with the transparent, electrically-conductive layer.

11. The optoelectronic semiconductor chip according to claim 1, further comprises a passivation layer covering in a lateral extent at least the p-type connection contact and the first blocking element in such a way that at least the p-type connection contact is protected from an external influence.

12. The optoelectronic semiconductor chip according to claim 1, wherein the first blocking element comprises at least three layers, and wherein the first blocking element comprises at least a first dielectric layer made of a first dielectric material with a refractive index n1 and at least a second dielectric layer made of a second dielectric material with a refractive index n2>n1.

13. The optoelectronic semiconductor chip according to claim 1, wherein the first blocking element comprises at least one of $Al_2O_3$, $Ta_2O_5$, $ZrO_2$, $ZnO$, $SiN_x$, $SiO_xN_y$, $SiO_2$, $TiO_2$, $ZrO_2$, $HfO_2$, $Nb_2O_5$, or $MgF_2$.

14. The optoelectronic semiconductor chip according to claim 1, wherein a lateral extent of the first trench is at least partially greater than a lateral extent of the p-type connection contact.

15. The optoelectronic semiconductor chip according to claim 1, wherein the second trench is arranged below the n-type connection contact, wherein the second trench extends at least partially through the p-doped semiconductor layer into the n-doped semiconductor layer, and wherein the second blocking element arranged at least partially within the second trench is arranged at least between the n-doped semiconductor layer and the n-type connection contact.

16. An optoelectronic semiconductor chip comprising:
at least one n-doped semiconductor layer;
at least one p-doped semiconductor layer; and
an active layer arranged between the at least one n-doped semiconductor layer and the at least one p-doped semiconductor layer,
wherein the n-doped semiconductor layer is electrically contacted by an n-type connection contact, wherein a trench extending at least partially into the n-doped semiconductor layer is arranged below the n-type connection contact, wherein a blocking element is arranged at least between the p-doped semiconductor layer and a p-type connection contact and at least partially arranged within the trench, wherein the blocking element is electrically insulating, wherein the trench comprises side flanks, wherein at least the side flanks of the trench are covered by the blocking element,
wherein the blocking element comprises at least three layers, wherein the blocking element comprises at least one first dielectric layer made of a first dielectric material with a refractive index n1 and at least one second dielectric layer made of a second dielectric material with a refractive index n2>n1, and wherein the active layer is configured to emit radiation of a dominant wavelength $\lambda$, and wherein $n1*d1 \geq 0.7\ \lambda/4$ is true for a thickness d1 of the at least one first dielectric layer and $n2*d2 \geq 0.7\ \lambda/4$ is true for a thickness d2 of the at least one second dielectric layer.

* * * * *